(12) United States Patent
Wang et al.

(10) Patent No.: US 11,349,604 B2
(45) Date of Patent: *May 31, 2022

(54) RESOURCE-BASED CODE BLOCK SEGMENTATION

(71) Applicant: QUALCOMM Incorporated, San Diego, CA (US)

(72) Inventors: Renqiu Wang, San Diego, CA (US); Jing Jiang, San Diego, CA (US); Joseph Binamira Soriaga, San Diego, CA (US); Thomas Joseph Richardson, South Orange, NJ (US); Vincent Loncke, Piscataway, NJ (US)

(73) Assignee: QUALCOMM Incorporated, San Diego, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/829,632

(22) Filed: Mar. 25, 2020

(65) Prior Publication Data

US 2020/0228239 A1    Jul. 16, 2020

Related U.S. Application Data

(63) Continuation of application No. 15/873,695, filed on Jan. 17, 2018, now Pat. No. 10,608,785.

(Continued)

(51) Int. Cl.
*H04L 1/00* (2006.01)
*H03M 13/05* (2006.01)
(Continued)

(52) U.S. Cl.
CPC .......... *H04L 1/0057* (2013.01); *H03M 13/05* (2013.01); *H03M 13/1102* (2013.01);
(Continued)

(58) Field of Classification Search
CPC ... H04L 5/0048; H04L 5/0044; H04L 5/0055; H04L 1/0057; H04L 1/0067;
(Continued)

(56) References Cited

U.S. PATENT DOCUMENTS 8,233,501 B2 *   7/2012   Terry .................... H04L 1/0003
                                                         370/473
8,266,513 B2 *   9/2012   Kim .................... H03M 13/258
                                                         714/807

(Continued)

FOREIGN PATENT DOCUMENTS

CN           102315911 A       1/2012
CN           102461039 A       5/2012
(Continued)

OTHER PUBLICATIONS

Ericsson: "On LDPC Code Parameters for NR", 3GPP Draft; R1-1700110 On LDPC Code Parameters for NR, 3rd Generation Partnership Project (3GPP), Mobile Competence Centre; 650, Route Des Lucioles; F-06921 Sophia-Antipolis Cedex; France vol. RAN WG1, No. Spokane, USA; Jan. 16, 2017-Jan. 20, 2017, Jan. 16, 2017 (Jan. 16, 2017), 8 Pages, XP051207653, Retrieved from the Internet: URL: http://www.3gpp.org/ftp/Meetings_3GPP_SYNC/RAN1/Docs/ [retrieved on Jan. 16, 2017].

(Continued)

*Primary Examiner* — Justin R Knapp
(74) *Attorney, Agent, or Firm* — Patterson & Sheridan, LLP

(57) ABSTRACT

Certain aspects of the present disclosure relate to methods and apparatus for optimizing delivery of a transport block (TB) using code rate dependent segmentation.

20 Claims, 8 Drawing Sheets

Related U.S. Application Data

(60) Provisional application No. 62/448,377, filed on Jan. 19, 2017.

(51) Int. Cl.
*H03M 13/11* (2006.01)
*H03M 13/09* (2006.01)
*H03M 13/00* (2006.01)

(52) U.S. Cl.
CPC ..... *H03M 13/635* (2013.01); *H03M 13/6516* (2013.01); *H04L 1/0043* (2013.01); *H04L 1/0052* (2013.01); *H04L 1/0067* (2013.01); *H03M 13/09* (2013.01); *H04L 1/0061* (2013.01)

(58) Field of Classification Search
CPC . H04L 1/0068; H04W 28/065; H03M 13/616; H03M 13/091; H03M 13/1174
See application file for complete search history.

(56) References Cited

U.S. PATENT DOCUMENTS

| | | | |
|---|---|---|---|
| 8,724,448 | B2 | 5/2014 | Roessel et al. |
| 9,100,981 | B2 | 8/2015 | Wengerter et al. |
| 9,160,485 | B2 | 10/2015 | Kim et al. |
| 9,374,184 | B2 | 6/2016 | Pajukoski et al. |
| 9,444,591 | B2 | 9/2016 | Pi et al. |
| 9,602,235 | B2 | 3/2017 | Roh et al. |
| 9,686,044 | B2 | 6/2017 | Malladi et al. |
| 10,608,785 | B2 | 3/2020 | Wang et al. |
| 2003/0152062 | A1* | 8/2003 | Terry ............ H04L 1/0009 370/349 |
| 2010/0251082 | A1 | 9/2010 | Cheng et al. |
| 2015/0098420 | A1 | 4/2015 | Luo et al. |
| 2015/0334653 | A1 | 11/2015 | Ang et al. |
| 2015/0381209 | A1* | 12/2015 | Roh ............ H03M 13/618 714/755 |
| 2016/0261280 | A1 | 9/2016 | Jeong et al. |
| 2016/0294512 | A1 | 10/2016 | Noh et al. |
| 2017/0126378 | A1 | 5/2017 | Luo et al. |
| 2017/0187489 | A1 | 6/2017 | Myung et al. |
| 2017/0373809 | A1 | 12/2017 | Kim et al. |
| 2018/0034585 | A1 | 2/2018 | Kim et al. |
| 2018/0098243 | A1 | 4/2018 | Kim et al. |
| 2018/0103476 | A1 | 4/2018 | Wong et al. |
| 2018/0205497 | A1 | 7/2018 | Wang et al. |

FOREIGN PATENT DOCUMENTS

| | | |
|---|---|---|
| CN | 103475448 A | 12/2013 |
| JP | 2011244509 A | 12/2011 |
| TW | 201625043 A | 7/2016 |
| TW | 201701624 A | 1/2017 |
| WO | 08086236 | 7/2008 |
| WO | WO-2008154646 A2 | 12/2008 |
| WO | 2016195754 A1 | 12/2016 |

OTHER PUBLICATIONS

International Search Report and Written Opinion—PCT/US2018/014145—ISA/EPO—dated Jul. 3, 2018.
Nokia, et al., "Code Segmentation for eMBB Data", 3GPP Draft; R1-1701029_Code_Segmentation, 3rd Generation Partnership Project (3GPP), Mobile Competence Centre; 650, Route Des Lucioles; F-06921 Sophia-Antipolis Cedex; France, vol. RAN WG1, No. Spokane, U.S.A.; Jan. 16, 2017-Jan. 20, 2017, Jan. 16, 2017 (Jan. 16, 2017), 4 Pages, XP051208544, Retrieved from the Internet: URL: http://www.3gpp.org/ftp/Meetings_3GPP_SYNC/RAN1/Docs/ [retrieved on Jan. 16, 2017].
ZTE: "Consideration on Coding Chain for eMBB Data Channel", 3GPP Draft; R1-1710844 Consideration On Coding Chain For EMBB Data Channel_Final, 3rd Generation Partnership Project (3GPP), mobile competence centre; 650, Route Des Lucioles; f-06921 Sophia-Antipol, vol. RAN WG1, No. Qingdao, P.R. China; Jun. 27, 2017-Jun. 30, 2017, Jun. 26, 2017 (Jun. 26, 2017), pp. 1-5, XP051300048, Retrieved from the Internet: URL: http://www.3gpp.org/ftp/Meetings_3GPP_SYNC/RAN1/Docs/ [retrieved on Jun. 26, 2017].
ZTE: "Support of Larger TBS and Larger POSCH/PUSCH # for MTC", 3GPP Draft; R1-167319 Support of Higher Bandwidth & TBS, 3rd Generation Partnership Project (3GPP), Mobile Competence Centre; 650, Route Des Lucioles; F-06921 Sophia-Antipolis Cedex; France, vol. RAN WG1, No. Gothenburg, Sweden; Aug. 22, 2016-Aug. 26, 2016, Aug. 21, 2016 (Aug. 21, 2016), 8 Pages, XP051125838, Retrieved from the Internet: URL: http://www.3gpp.org/ftp/Meetings_3GPP_SYNC/RAN1/Docs/ [retrieved on Aug. 21, 2016].
Taiwan Search Report—TW107101815—TIPO—dated Jul. 13, 2021.
SAMSUNG: "Flexibility of LDPC—Length, Rate and IR-HARQ", 3GPP Draft, 3GPP TSG RAN WG1 #85, R1-164007 3rd Generation Partnership Project (3GPP), Mobile Competence Centre, 650, Route Des Lucioles, F-06921 Sophia-Antipolis Cedex, France, vol. RAN WG1. No. Nanjing, China, May 23, 2016-May 27, 2016 May 14, 2016 (May 14, 2016), XP051090116, 8 Pages, Retrieved from the Internet: URL:http://www.3gpp.org/ftp/tsg_ran/WG1_RL1/TSGR1_85/Docs/[retrieved on May 14, 2016], p. 1-p. 3 p. 6.

* cited by examiner

RESOURCE-BASED CODE BLOCK SEGMENTATION

CROSS-REFERENCE TO RELATED APPLICATIONS

The present Application for Patent is a continuation of U.S. application Ser. No. 15/873,695, filed Jan. 17, 2018, which claims the benefit of U.S. Provisional Patent Application Ser. No. 62/448,377, filed Jan. 19, 2017, which are both assigned to the assignee hereof and hereby expressly incorporated by reference herein.

FIELD

The present disclosure relates generally to communication systems, and more particularly, to methods and apparatus for optimizing transport block delivery using resource based code block segmentation.

BACKGROUND

Wireless communication systems are widely deployed to provide various telecommunication services such as telephony, video, data, messaging, and broadcasts. Typical wireless communication systems may employ multiple-access technologies capable of supporting communication with multiple users by sharing available system resources (e.g., bandwidth, transmit power). Examples of such multiple-access technologies include Long Term Evolution (LTE) systems, code division multiple access (CDMA) systems, time division multiple access (TDMA) systems, frequency division multiple access (FDMA) systems, orthogonal frequency division multiple access (OFDMA) systems, single-carrier frequency division multiple access (SC-FDMA) systems, and time division synchronous code division multiple access (TD-SCDMA) systems.

In some examples, a wireless multiple-access communication system may include a number of base stations, each simultaneously supporting communication for multiple communication devices, otherwise known as user equipment (UEs). In LTE or LTE-A network, a set of one or more base stations may define an eNodeB (eNB). In other examples (e.g., in a next generation or 5G network), a wireless multiple access communication system may include a number of distributed units (DUs) (e.g., edge units (EUs), edge nodes (ENs), radio heads (RHs), smart radio heads (SRHs), transmission reception points (TRPs), etc.) in communication with a number of central units (CUs) (e.g., central nodes (CNs), access node controllers (ANCs), etc.), where a set of one or more distributed units, in communication with a central unit, may define an access node (e.g., a new radio base station (NR BS), a new radio node-B (NR NB), a network node, 5G NB, eNB, etc.). A base station or DU may communicate with a set of UEs on downlink channels (e.g., for transmissions from a base station or to a UE) and uplink channels (e.g., for transmissions from a UE to a base station or distributed unit).

These multiple access technologies have been adopted in various telecommunication standards to provide a common protocol that enables different wireless devices to communicate on a municipal, national, regional, and even global level. An example of an emerging telecommunication standard is new radio (NR), for example, 5G radio access. NR is a set of enhancements to the LTE mobile standard promulgated by Third Generation Partnership Project (3GPP). It is designed to better support mobile broadband Internet access by improving spectral efficiency, lowering costs, improving services, making use of new spectrum, and better integrating with other open standards using OFDMA with a cyclic prefix (CP) on the downlink (DL) and on the uplink (UL) as well as support beamforming, multiple-input multiple-output (MIMO) antenna technology, and carrier aggregation.

However, as the demand for mobile broadband access continues to increase, there exists a need for further improvements in NR technology. Preferably, these improvements should be applicable to other multi-access technologies and the telecommunication standards that employ these technologies.

SUMMARY

The systems, methods, and devices of the disclosure each have several aspects, no single one of which is solely responsible for its desirable attributes. Without limiting the scope of this disclosure as expressed by the claims which follow, some features will now be discussed briefly. After considering this discussion, and particularly after reading the section entitled "Detailed Description" one will understand how the features of this disclosure provide advantages that include improved communications between access points and stations in a wireless network.

Certain aspects of the present disclosure generally relate to optimizing transport block delivery using resource based code block segmentation.

Certain aspects provide a method for wireless communications involving code rate-based segmentation. The method generally includes determining over the air resources available for sending a transport block (TB), and performing segmentation of the TB into smaller code blocks (CBs) based on the determination and a corresponding code rate for the code blocks, and transmitting the code blocks.

Aspects generally include methods, apparatus, systems, computer readable mediums, and processing systems, as substantially described herein with reference to and as illustrated by the accompanying drawings.

To the accomplishment of the foregoing and related ends, the one or more aspects comprise the features hereinafter fully described and particularly pointed out in the claims. The following description and the annexed drawings set forth in detail certain illustrative features of the one or more aspects. These features are indicative, however, of but a few of the various ways in which the principles of various aspects may be employed, and this description is intended to include all such aspects and their equivalents.

BRIEF DESCRIPTION OF THE DRAWINGS

So that the manner in which the above-recited features of the present disclosure can be understood in detail, a more particular description, briefly summarized above, may be had by reference to aspects, some of which are illustrated in the appended drawings. It is to be noted, however, that the appended drawings illustrate only certain typical aspects of this disclosure and are therefore not to be considered limiting of its scope, for the description may admit to other equally effective aspects.

To facilitate understanding, identical reference numerals have been used, where possible, to designate identical elements that are common to the figures. It is contemplated that elements disclosed in one aspect may be beneficially utilized on other aspects without specific recitation.

DETAILED DESCRIPTION

Figure 1:
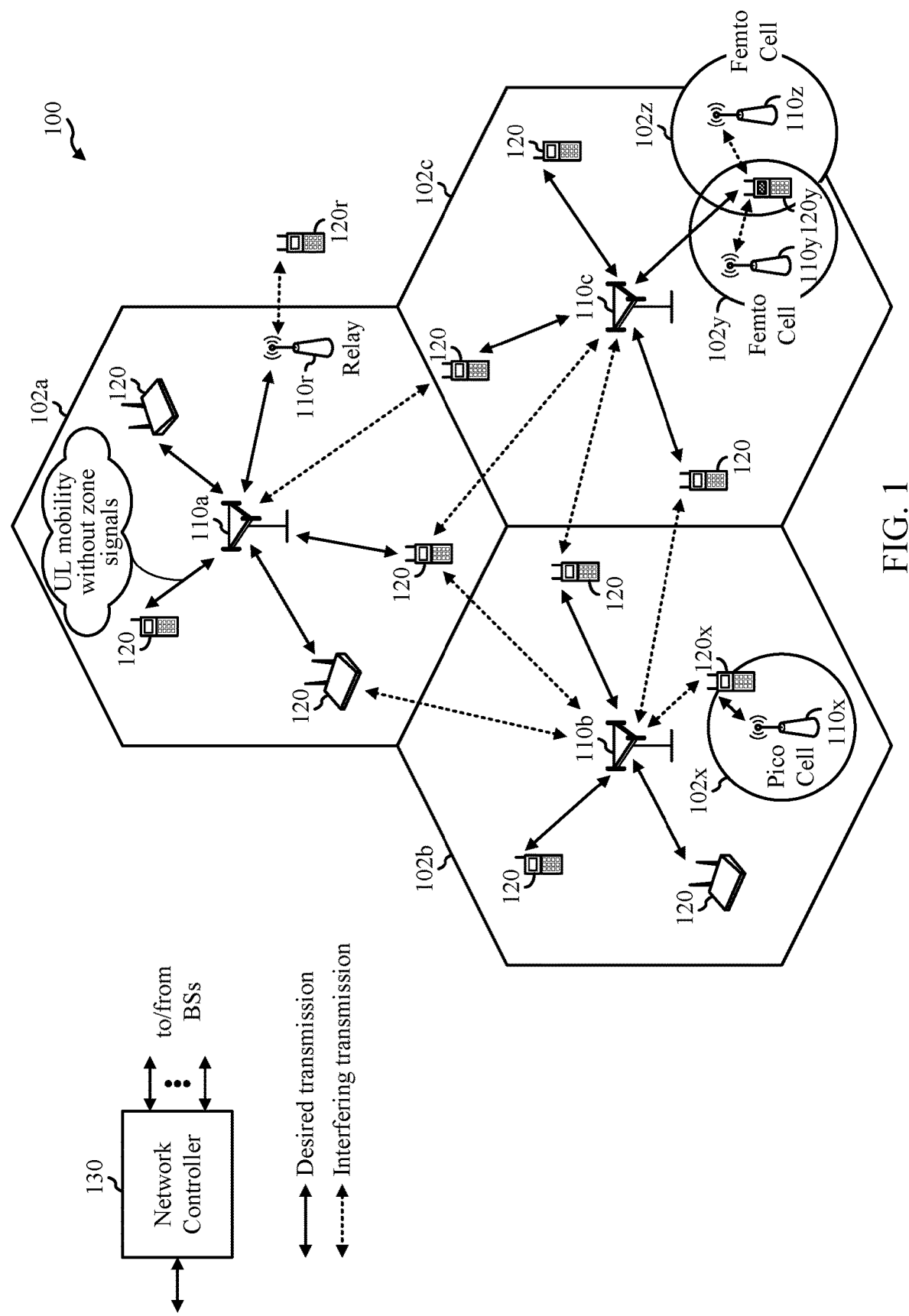
FIG. 1 is a block diagram conceptually illustrating an example telecommunications system, in accordance with certain aspects of the present disclosure.

Aspects of the present disclosure provide apparatus, methods, processing systems, and computer readable mediums for new radio (NR) (new radio access technology or 5G technology).

NR may support various wireless communication services, such as Enhanced mobile broadband (eMBB) targeting wide bandwidth (e.g. 80 MHz beyond), millimeter wave (mmW) targeting high carrier frequency (e.g. 60 GHz), massive MTC (mMTC) targeting non-backward compatible MTC techniques, and/or mission critical targeting ultra-reliable low latency communications (URLLC). These services may include latency and reliability requirements. These services may also have different transmission time intervals (TTI) to meet respective quality of service (QoS) requirements. In addition, these services may co-exist in the same subframe.

Aspects of the present disclosure relate to resource-based code block segmentation.

The following description provides examples, and is not limiting of the scope, applicability, or examples set forth in the claims. Changes may be made in the function and arrangement of elements discussed without departing from the scope of the disclosure. Various examples may omit, substitute, or add various procedures or components as appropriate. For instance, the methods described may be performed in an order different from that described, and various steps may be added, omitted, or combined. Also, features described with respect to some examples may be combined in some other examples. For example, an apparatus may be implemented or a method may be practiced using any number of the aspects set forth herein. In addition, the scope of the disclosure is intended to cover such an apparatus or method which is practiced using other structure, functionality, or structure and functionality in addition to or other than the various aspects of the disclosure set forth herein. It should be understood that any aspect of the disclosure disclosed herein may be embodied by one or more elements of a claim. The word "exemplary" is used herein to mean "serving as an example, instance, or illustration." Any aspect described herein as "exemplary" is not necessarily to be construed as preferred or advantageous over other aspects.

The techniques described herein may be used for various wireless communication networks such as LTE, CDMA, TDMA, FDMA, OFDMA, SC-FDMA and other networks. The terms "network" and "system" are often used interchangeably. A CDMA network may implement a radio technology such as Universal Terrestrial Radio Access (UTRA), cdma2000, etc. UTRA includes Wideband CDMA (WCDMA) and other variants of CDMA. cdma2000 covers IS-2000, IS-95 and IS-856 standards. A TDMA network may implement a radio technology such as Global System for Mobile Communications (GSM). An OFDMA network may implement a radio technology such as NR (e.g. 5G RA), Evolved UTRA (E-UTRA), Ultra Mobile Broadband (UMB), IEEE 802.11 (Wi-Fi), IEEE 802.16 (WiMAX), IEEE 802.20, Flash-OFDMA, etc. UTRA and E-UTRA are part of Universal Mobile Telecommunication System (UMTS). NR is an emerging wireless communications technology under development in conjunction with the 5G Technology Forum (SGTF). 3GPP Long Term Evolution (LTE) and LTE-Advanced (LTE-A) are releases of UMTS that use E-UTRA. UTRA, E-UTRA, UMTS, LTE, LTE-A and GSM are described in documents from an organization named "3rd Generation Partnership Project" (3GPP). cdma2000 and UMB are described in documents from an organization named "3rd Generation Partnership Project 2" (3GPP2). The techniques described herein may be used for the wireless networks and radio technologies mentioned above as well as other wireless networks and radio technologies. For clarity, while aspects may be described herein using terminology commonly associated with 3G and/or 4G wireless technologies, aspects of the present disclosure can be applied in other generation-based communication systems, such as 5G and later, including NR technologies.

Example Wireless Communications System

FIG. 1 illustrates an example wireless network 100, such as a new radio (NR) or 5G network, in which aspects of the present disclosure may be performed, for example, for enabling connectivity sessions and internet protocol (IP) establishment, as described in greater detail below.

As illustrated in FIG. 1, the wireless network 100 may include a number of BSs 110 and other network entities. A BS may be a station that communicates with UEs. Each BS 110 may provide communication coverage for a particular geographic area. In 3GPP, the term "cell" can refer to a coverage area of a Node B and/or a Node B subsystem serving this coverage area, depending on the context in which the term is used. In NR systems, the term "cell" and eNB, Node B, 5G NB, AP, NR BS, NR BS, or TRP may be interchangeable. In some examples, a cell may not necessarily be stationary, and the geographic area of the cell may move according to the location of a mobile base station. In some examples, the base stations may be interconnected to one another and/or to one or more other base stations or network nodes (not shown) in the wireless network 100 through various types of backhaul interfaces such as a direct physical connection, a virtual network, or the like using any suitable transport network.

In general, any number of wireless networks may be deployed in a given geographic area. Each wireless network may support a particular radio access technology (RAT) and may operate on one or more frequencies. A RAT may also be referred to as a radio technology, an air interface, etc. A frequency may also be referred to as a carrier, a frequency channel, etc. Each frequency may support a single RAT in a given geographic area in order to avoid interference between wireless networks of different RATs. In some cases, NR or 5G RAT networks may be deployed.

A BS may provide communication coverage for a macro cell, a pico cell, a femto cell, and/or other types of cell. A macro cell may cover a relatively large geographic area (e.g., several kilometers in radius) and may allow unrestricted access by UEs with service subscription. A pico cell may cover a relatively small geographic area and may allow unrestricted access by UEs with service subscription. A femto cell may cover a relatively small geographic area (e.g., a home) and may allow restricted access by UEs having association with the femto cell (e.g., UEs in a Closed Subscriber Group (CSG), UEs for users in the home, etc.). A BS for a macro cell may be referred to as a macro BS. A BS for a pico cell may be referred to as a pico BS. A BS for a femto cell may be referred to as a femto BS or a home BS. In the example shown in FIG. 1, the BSs 110a, 110b and 110c may be macro BSs for the macro cells 102a, 102b and 102c, respectively. The BS 110x may be a pico BS for a pico cell 102x. The BSs 110y and 110z may be femto BS for the femto cells 102y and 102z, respectively. A BS may support one or multiple (e.g., three) cells.

The wireless network 100 may also include relay stations. A relay station is a station that receives a transmission of data and/or other information from an upstream station (e.g., a BS or a UE) and sends a transmission of the data and/or other information to a downstream station (e.g., a UE or a BS). A relay station may also be a UE that relays transmissions for other UEs. In the example shown in FIG. 1, a relay station 110r may communicate with the BS 110a and a UE 120r in order to facilitate communication between the BS 110a and the UE 120r. A relay station may also be referred to as a relay BS, a relay, etc.

The wireless network 100 may be a heterogeneous network that includes BSs of different types, e.g., macro BS, pico BS, femto BS, relays, etc. These different types of BSs may have different transmit power levels, different coverage areas, and different impact on interference in the wireless network 100. For example, macro BS may have a high transmit power level (e.g., 20 Watts) whereas pico BS, femto BS, and relays may have a lower transmit power level (e.g., 1 Watt).

The wireless network 100 may support synchronous or asynchronous operation. For synchronous operation, the BSs may have similar frame timing, and transmissions from different BSs may be approximately aligned in time. For asynchronous operation, the BSs may have different frame timing, and transmissions from different BSs may not be aligned in time. The techniques described herein may be used for both synchronous and asynchronous operation.

A network controller 130 may be coupled to a set of BSs 110 and provide coordination and control for these BSs. The network controller 130 may communicate with the BSs 110 via a backhaul. The BSs 110 may also communicate with one another, e.g., directly or indirectly via wireless or wireline backhaul.

The UEs 120 (e.g., 120x, 120y, etc.) may be dispersed throughout the wireless network 100, and each UE may be stationary or mobile. A UE may also be referred to as a mobile station, a terminal, an access terminal, a subscriber unit, a station, a Customer Premises Equipment (CPE), a cellular phone, a smart phone, a personal digital assistant (PDA), a wireless modem, a wireless communication device, a handheld device, a laptop computer, a cordless phone, a wireless local loop (WLL) station, a tablet, a camera, a gaming device, a netbook, a smartbook, an ultrabook, a medical device or medical equipment, a biometric sensor/device, a wearable device such as a smart watch, smart clothing, smart glasses, a smart wrist band, smart jewelry (e.g., a smart ring, a smart bracelet, etc.), an entertainment device (e.g., a music device, a video device, a satellite radio, etc.), a vehicular component or sensor, a smart meter/sensor, industrial manufacturing equipment, a global positioning system device, or any other suitable device that is configured to communicate via a wireless or wired medium. Some UEs may be considered evolved or machine-type communication (MTC) devices or evolved MTC (eMTC) devices. MTC and eMTC UEs include, for example, robots, drones, remote devices, sensors, meters, monitors, location tags, etc., that may communicate with a BS, another device (e.g., remote device), or some other entity. A wireless node may provide, for example, connectivity for or to a network (e.g., a wide area network such as Internet or a cellular network) via a wired or wireless communication link. Some UEs may be considered Internet-of-Things (IoT) devices.

In FIG. 1, a solid line with double arrows indicates desired transmissions between a UE and a serving BS, which is a BS designated to serve the UE on the downlink and/or uplink. A dashed line with double arrows indicates interfering transmissions between a UE and a BS.

Certain wireless networks (e.g., LTE) utilize orthogonal frequency division multiplexing (OFDM) on the downlink and single-carrier frequency division multiplexing (SC-FDM) on the uplink. OFDM and SC-FDM partition the system bandwidth into multiple (K) orthogonal subcarriers, which are also commonly referred to as tones, bins, etc. Each subcarrier may be modulated with data. In general, modulation symbols are sent in the frequency domain with OFDM and in the time domain with SC-FDM. The spacing between adjacent subcarriers may be fixed, and the total number of subcarriers (K) may be dependent on the system bandwidth. For example, the spacing of the subcarriers may be 15 kHz and the minimum resource allocation (called a 'resource block') may be 12 subcarriers (or 180 kHz). Consequently, the nominal FFT size may be equal to 128, 256, 512, 1024 or 2048 for system bandwidth of 1.25, 2.5, 5, 10 or 20 megahertz (MHz), respectively. The system bandwidth may also be partitioned into subbands. For example, a subband may cover 1.08 MHz (i.e., 6 resource blocks), and there may be 1, 2, 4, 8 or 16 subbands for system bandwidth of 1.25, 2.5, 5, 10 or 20 MHz, respectively.

While aspects of the examples described herein may be associated with LTE technologies, aspects of the present disclosure may be applicable with other wireless communications systems, such as NR. NR may utilize OFDM with a CP on the uplink and downlink and include support for half-duplex operation using time division duplex (TDD). A single component carrier bandwidth of 100 MHz may be supported. NR resource blocks may span 12 sub-carriers with a sub-carrier bandwidth of 75 kHz over a 0.1 ms duration. Each radio frame may consist of 50 subframes with a length of 10 ms. Consequently, each subframe may have a length of 0.2 ms. Each subframe may indicate a link direction (i.e., DL or UL) for data transmission and the link direction for each subframe may be dynamically switched. Each subframe may include DL/UL data as well as DL/UL control data. UL and DL subframes for NR may be as described in more detail below with respect to FIGS. 6 and 7. Beamforming may be supported and beam direction may be dynamically configured. MIMO transmissions with precoding may also be supported. MIMO configurations in the DL may support up to 8 transmit antennas with multi-layer DL transmissions up to 8 streams and up to 2 streams per UE. Multi-layer transmissions with up to 2 streams per UE may be supported. Aggregation of multiple cells may be supported with up to 8 serving cells. Alternatively, NR may support a different air interface, other than an OFDM-based. NR networks may include entities such CUs and/or DUs.

In some examples, access to the air interface may be scheduled, wherein a scheduling entity (e.g., a base station) allocates resources for communication among some or all devices and equipment within its service area or cell. Within the present disclosure, as discussed further below, the scheduling entity may be responsible for scheduling, assigning, reconfiguring, and releasing resources for one or more subordinate entities. That is, for scheduled communication, subordinate entities utilize resources allocated by the scheduling entity. Base stations are not the only entities that may function as a scheduling entity. That is, in some examples, a UE may function as a scheduling entity, scheduling resources for one or more subordinate entities (e.g., one or more other UEs). In this example, the UE is functioning as a scheduling entity, and other UEs utilize resources scheduled by the UE for wireless communication. A UE may function as a scheduling entity in a peer-to-peer (P2P) network, and/or in a mesh network. In a mesh network example, UEs may optionally communicate directly with one another in addition to communicating with the scheduling entity.

Thus, in a wireless communication network with a scheduled access to time-frequency resources and having a cellular configuration, a P2P configuration, and a mesh configuration, a scheduling entity and one or more subordinate entities may communicate utilizing the scheduled resources.

As noted above, a RAN may include a CU and DUs. A NR BS (e.g., eNB, 5G Node B, Node B, transmission reception point (TRP), access point (AP)) may correspond to one or multiple BSs. NR cells can be configured as access cell (ACells) or data only cells (DCells). For example, the RAN (e.g., a central unit or distributed unit) can configure the cells. DCells may be cells used for carrier aggregation or dual connectivity, but not used for initial access, cell selection/reselection, or handover. In some cases DCells may not transmit synchronization signals—in some case cases DCells may transmit SS. NR BSs may transmit downlink signals to UEs indicating the cell type. Based on the cell type indication, the UE may communicate with the NR BS. For example, the UE may determine NR BSs to consider for cell selection, access, handover, and/or measurement based on the indicated cell type.

Figure 2:
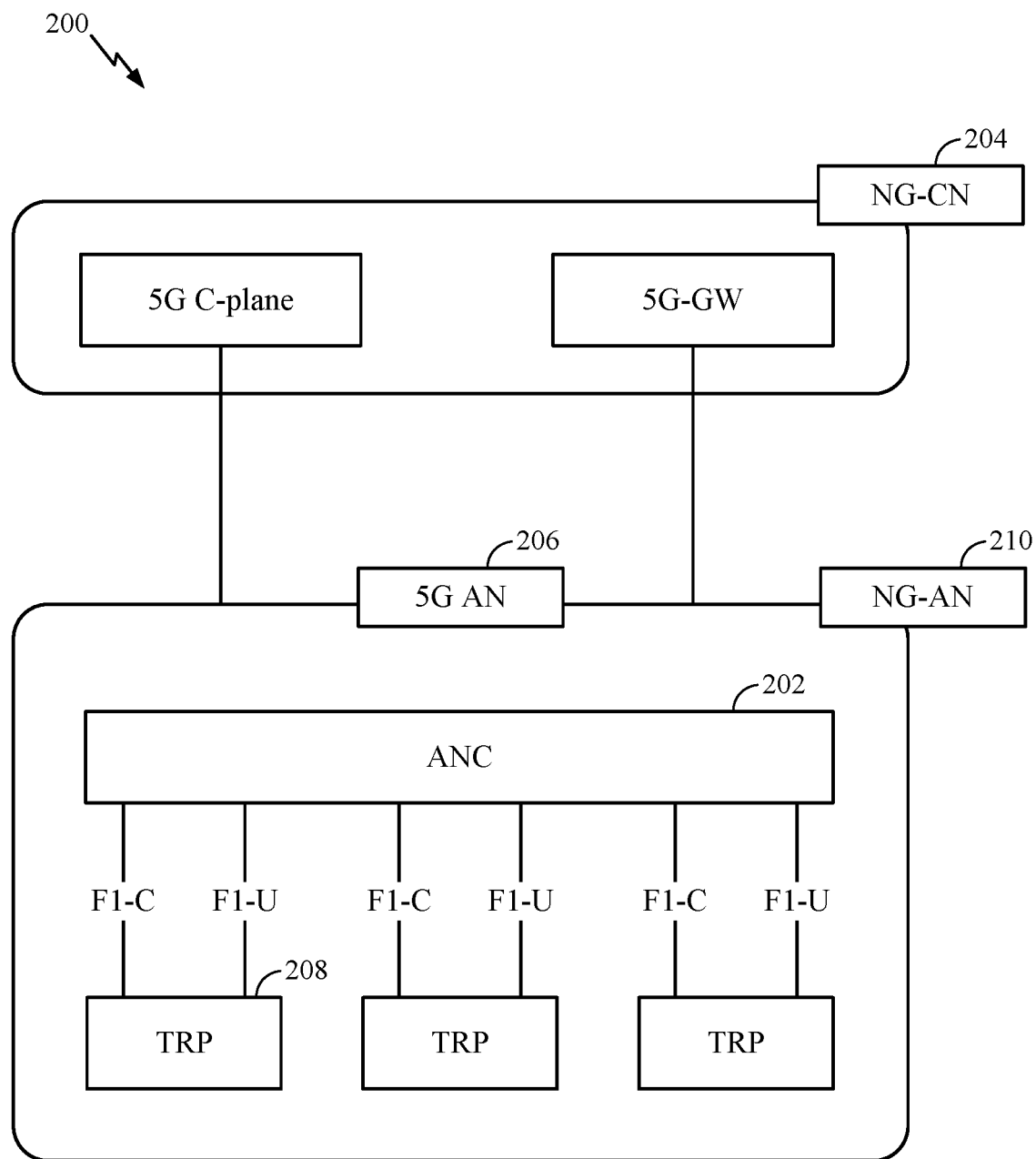
FIG. 2 is a block diagram illustrating an example logical architecture of a distributed RAN, in accordance with certain aspects of the present disclosure.

FIG. 2 illustrates an example logical architecture of a distributed radio access network (RAN) 200, which may be implemented in the wireless communication system illustrated in FIG. 1. A 5G access node 206 may include an access node controller (ANC) 202. The ANC may be a central unit (CU) of the distributed RAN 200. The backhaul interface to the next generation core network (NG-CN) 204 may terminate at the ANC. The backhaul interface to neighboring next generation access nodes (NG-ANs) may terminate at the ANC. The ANC may include one or more TRPs 208 (which may also be referred to as BSs, NR BSs, Node Bs, 5G NBs, APs, or some other term). As described above, a TRP may be used interchangeably with "cell."

The TRPs 208 may be a DU. The TRPs may be connected to one ANC (ANC 202) or more than one ANC (not illustrated). For example, for RAN sharing, radio as a service (RaaS), and service specific AND deployments, the TRP may be connected to more than one ANC. A TRP may include one or more antenna ports. The TRPs may be configured to individually (e.g., dynamic selection) or jointly (e.g., joint transmission) serve traffic to a UE.

The local architecture 200 may be used to illustrate fronthaul definition. The architecture may be defined that support fronthauling solutions across different deployment types. For example, the architecture may be based on transmit network capabilities (e.g., bandwidth, latency, and/or jitter).

The architecture may share features and/or components with LTE. According to aspects, the next generation AN (NG-AN) 210 may support dual connectivity with NR. The NG-AN may share a common fronthaul for LTE and NR.

The architecture may enable cooperation between and among TRPs 208. For example, cooperation may be preset within a TRP and/or across TRPs via the ANC 202. According to aspects, no inter-TRP interface may be needed/present.

According to aspects, a dynamic configuration of split logical functions may be present within the architecture 200. As will be described in more detail with reference to FIG. 5, the Radio Resource Control (RRC) layer, Packet Data Convergence Protocol (PDCP) layer, Radio Link Control (RLC) layer, Medium Access Control (MAC) layer, and a Physical (PHY) layers may be adaptably placed at the DU or CU (e.g., TRP or ANC, respectively). According to certain aspects, a BS may include a central unit (CU) (e.g., ANC 202) and/or one or more distributed units (e.g., one or more TRPs 208).

Figure 3:
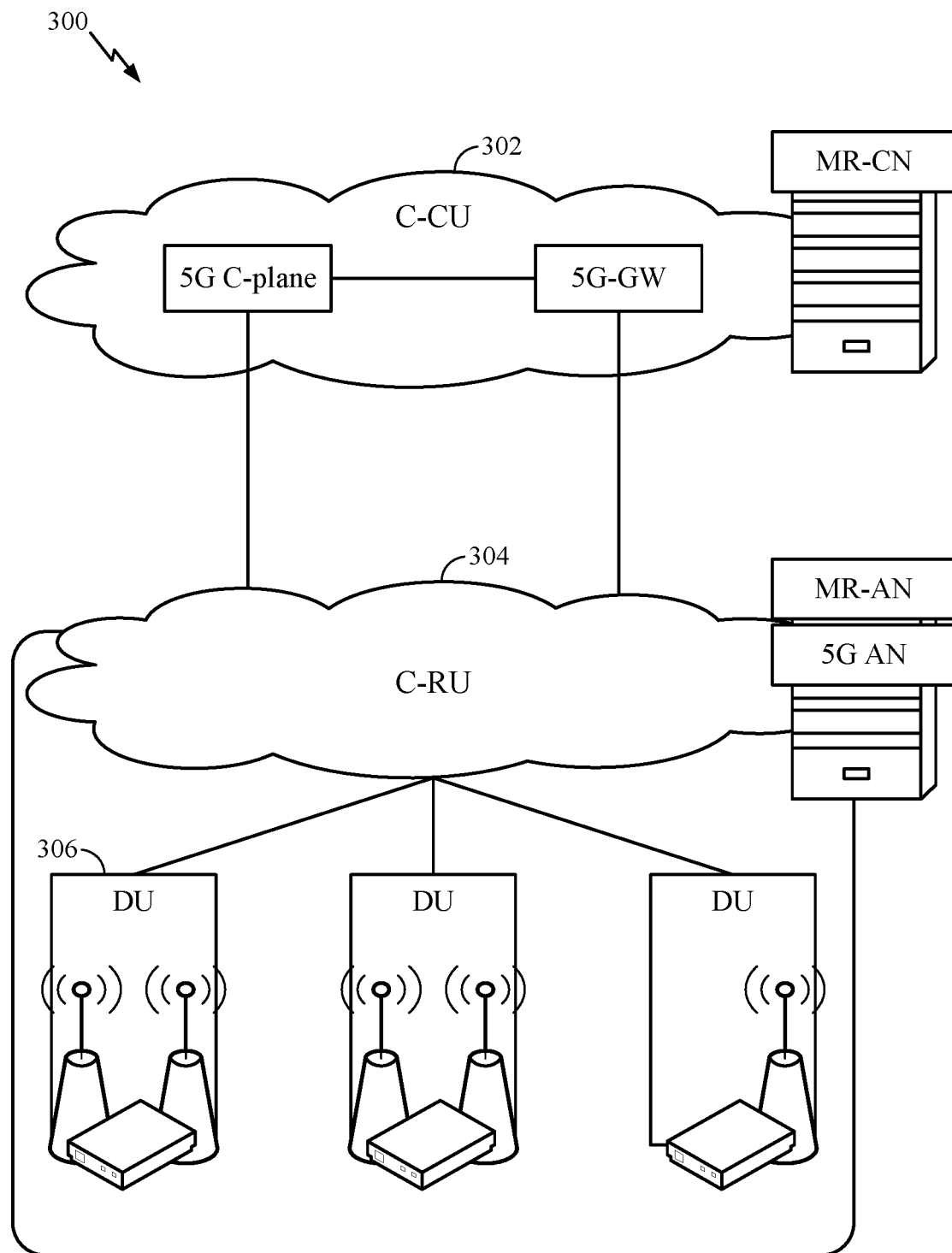
FIG. 3 is a diagram illustrating an example physical architecture of a distributed RAN, in accordance with certain aspects of the present disclosure.

FIG. 3 illustrates an example physical architecture of a distributed RAN 300, according to aspects of the present disclosure. A centralized core network unit (C-CU) 302 may host core network functions. The C-CU may be centrally deployed. C-CU functionality may be offloaded (e.g., to advanced wireless services (AWS)), in an effort to handle peak capacity.

A centralized RAN unit (C-RU) 304 may host one or more ANC functions. Optionally, the C-RU may host core network functions locally. The C-RU may have distributed deployment. The C-RU may be closer to the network edge.

A DU 306 may host one or more TRPs (edge node (EN), an edge unit (EU), a radio head (RH), a smart radio head (SRH), or the like). The DU may be located at edges of the network with radio frequency (RF) functionality.

Figure 4:
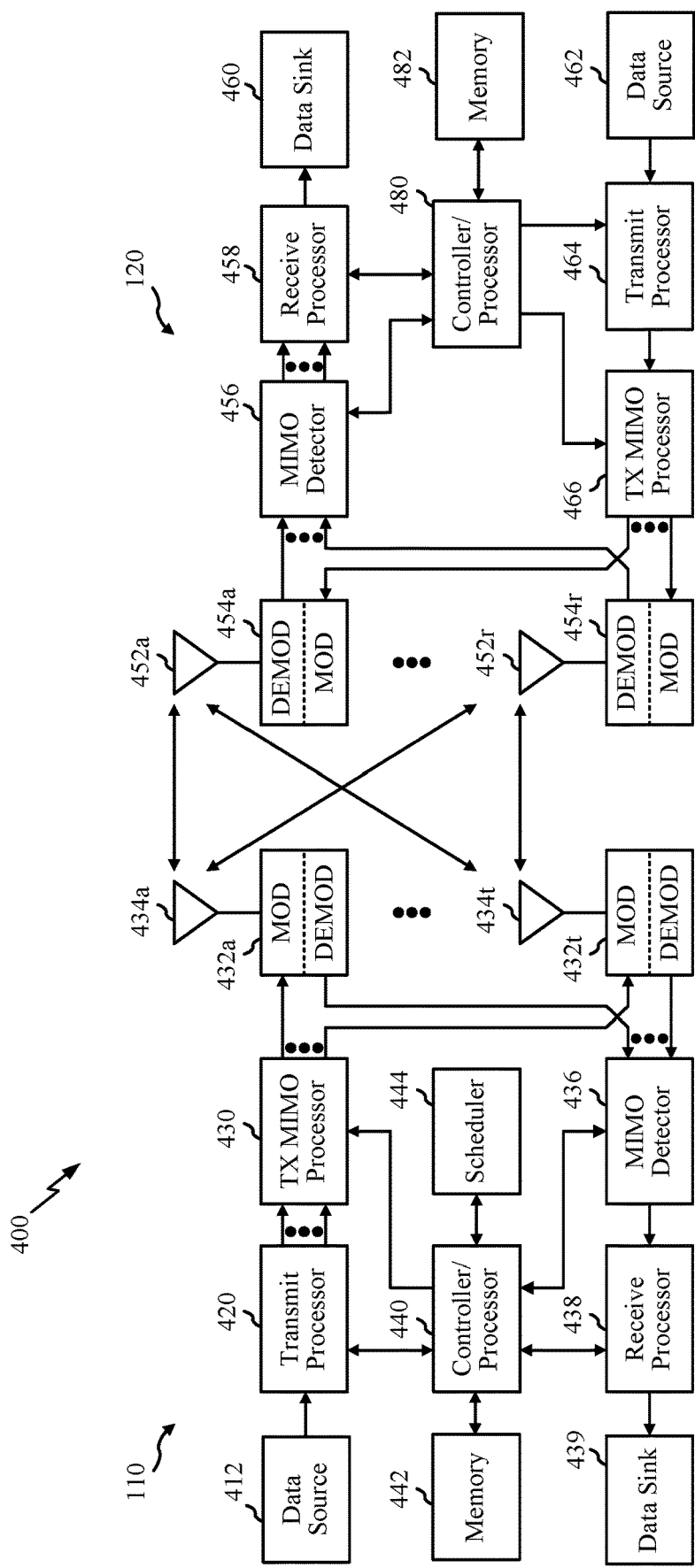
FIG. 4 is a block diagram conceptually illustrating a design of an example BS and user equipment (UE), in accordance with certain aspects of the present disclosure.

FIG. 4 illustrates example components of the BS 110 and UE 120 illustrated in FIG. 1, which may be used to implement aspects of the present disclosure. As described above, the BS may include a TRP. One or more components of the BS 110 and UE 120 may be used to practice aspects of the present disclosure. For example, antennas 452, Tx/Rx 222, processors 466, 458, 464, and/or controller/processor 480 of the UE 120 and/or antennas 434, processors 460, 420, 438, and/or controller/processor 440 of the BS 110 may be used to perform the operations described herein and illustrated with reference to FIG. 13.

FIG. 4 shows a block diagram of a design of a BS 110 and a UE 120, which may be one of the BSs and one of the UEs in FIG. 1. For a restricted association scenario, the base station 110 may be the macro BS 110c in FIG. 1, and the UE 120 may be the UE 120y. The base station 110 may also be a base station of some other type. The base station 110 may be equipped with antennas 434a through 434t, and the UE 120 may be equipped with antennas 452a through 452r.

At the base station 110, a transmit processor 420 may receive data from a data source 412 and control information from a controller/processor 440. The control information may be for the Physical Broadcast Channel (PBCH), Physical Control Format Indicator Channel (PCFICH), Physical Hybrid ARQ Indicator Channel (PHICH), Physical Downlink Control Channel (PDCCH), etc. The data may be for the Physical Downlink Shared Channel (PDSCH), etc. The processor 420 may process (e.g., encode and symbol map) the data and control information to obtain data symbols and control symbols, respectively. The processor 420 may also generate reference symbols, e.g., for the PSS, SSS, and cell-specific reference signal. A transmit (TX) multiple-input multiple-output (MIMO) processor 430 may perform spatial processing (e.g., precoding) on the data symbols, the control symbols, and/or the reference symbols, if applicable, and may provide output symbol streams to the modulators (MODs) 432*a* through 432*t*. For example, the TX MIMO processor 430 may perform certain aspects described herein for RS multiplexing. Each modulator 432 may process a respective output symbol stream (e.g., for OFDM, etc.) to obtain an output sample stream. Each modulator 432 may further process (e.g., convert to analog, amplify, filter, and upconvert) the output sample stream to obtain a downlink signal. Downlink signals from modulators 432*a* through 432*t* may be transmitted via the antennas 434*a* through 434*t*, respectively.

At the UE 120, the antennas 452*a* through 452*r* may receive the downlink signals from the base station 110 and may provide received signals to the demodulators (DEMODs) 454*a* through 454*r*, respectively. Each demodulator 454 may condition (e.g., filter, amplify, downconvert, and digitize) a respective received signal to obtain input samples. Each demodulator 454 may further process the input samples (e.g., for OFDM, etc.) to obtain received symbols. A MIMO detector 456 may obtain received symbols from all the demodulators 454*a* through 454*r*, perform MIMO detection on the received symbols if applicable, and provide detected symbols. For example, MIMO detector 456 may provide detected RS transmitted using techniques described herein. A receive processor 458 may process (e.g., demodulate, deinterleave, and decode) the detected symbols, provide decoded data for the UE 120 to a data sink 460, and provide decoded control information to a controller/processor 480.

On the uplink, at the UE 120, a transmit processor 464 may receive and process data (e.g., for the Physical Uplink Shared Channel (PUSCH)) from a data source 462 and control information (e.g., for the Physical Uplink Control Channel (PUCCH) from the controller/processor 480. The transmit processor 464 may also generate reference symbols for a reference signal. The symbols from the transmit processor 464 may be precoded by a TX MIMO processor 466 if applicable, further processed by the demodulators 454*a* through 454*r* (e.g., for SC-FDM, etc.), and transmitted to the base station 110. At the BS 110, the uplink signals from the UE 120 may be received by the antennas 434, processed by the modulators 432, detected by a MIMO detector 436 if applicable, and further processed by a receive processor 438 to obtain decoded data and control information sent by the UE 120. The receive processor 438 may provide the decoded data to a data sink 439 and the decoded control information to the controller/processor 440.

The controllers/processors 440 and 480 may direct the operation at the base station 110 and the UE 120, respectively. The processor 440 and/or other processors and modules at the base station 110 may perform or direct, e.g., the execution of the functional blocks illustrated in FIG. 8, and/or other processes for the techniques described herein.

The processor 480 and/or other processors and modules at the UE 120 may also perform or direct processes for the techniques described herein. The memories 442 and 482 may store data and program codes for the BS 110 and the UE 120, respectively. A scheduler 444 may schedule UEs for data transmission on the downlink and/or uplink.

Figure 5:
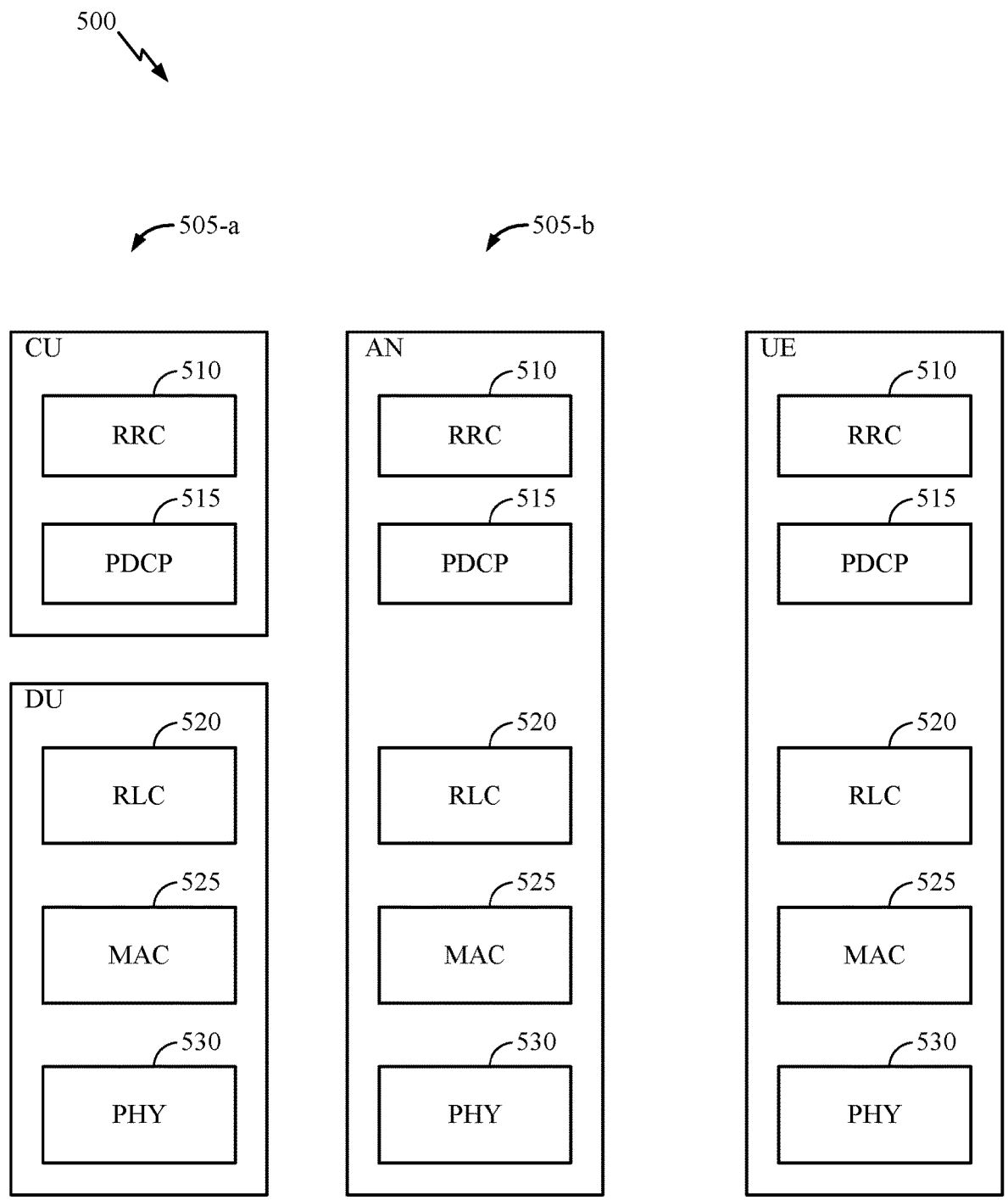
FIG. 5 is a diagram showing examples for implementing a communication protocol stack, in accordance with certain aspects of the present disclosure.

FIG. 5 illustrates a diagram 500 showing examples for implementing a communications protocol stack, according to aspects of the present disclosure. The illustrated communications protocol stacks may be implemented by devices operating in a in a 5G system (e.g., a system that supports uplink-based mobility). Diagram 500 illustrates a communications protocol stack including a Radio Resource Control (RRC) layer 510, a Packet Data Convergence Protocol (PDCP) layer 515, a Radio Link Control (RLC) layer 520, a Medium Access Control (MAC) layer 525, and a Physical (PHY) layer 530. In various examples the layers of a protocol stack may be implemented as separate modules of software, portions of a processor or ASIC, portions of non-collocated devices connected by a communications link, or various combinations thereof. Collocated and non-collocated implementations may be used, for example, in a protocol stack for a network access device (e.g., ANs, CUs, and/or DUs) or a UE.

A first option 505-*a* shows a split implementation of a protocol stack, in which implementation of the protocol stack is split between a centralized network access device (e.g., an ANC 202 in FIG. 2) and distributed network access device (e.g., DU 208 in FIG. 2). In the first option 505-*a*, an RRC layer 510 and a PDCP layer 515 may be implemented by the central unit, and an RLC layer 520, a MAC layer 525, and a PHY layer 530 may be implemented by the DU. In various examples the CU and the DU may be collocated or non-collocated. The first option 505-*a* may be useful in a macro cell, micro cell, or pico cell deployment.

A second option 505-*b* shows a unified implementation of a protocol stack, in which the protocol stack is implemented in a single network access device (e.g., access node (AN), new radio base station (NR BS), a new radio Node-B (NR NB), a network node (NN), or the like). In the second option, the RRC layer 510, the PDCP layer 515, the RLC layer 520, the MAC layer 525, and the PHY layer 530 may each be implemented by the AN. The second option 505-*b* may be useful in a femto cell deployment.

Regardless of whether a network access device implements part or all of a protocol stack, a UE may implement an entire protocol stack (e.g., the RRC layer 510, the PDCP layer 515, the RLC layer 520, the MAC layer 525, and the PHY layer 530).

Figure 6:
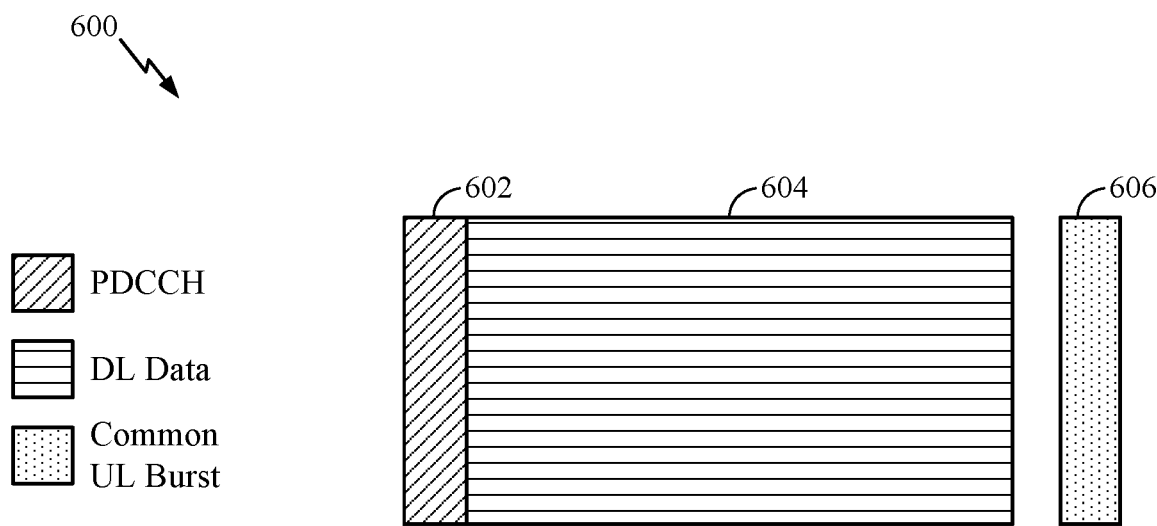
FIG. 6 illustrates an example of a DL-centric subframe, in accordance with certain aspects of the present disclosure.

FIG. 6 is a diagram 600 showing an example of a DL-centric subframe. The DL-centric subframe may include a control portion 602. The control portion 602 may exist in the initial or beginning portion of the DL-centric subframe. The control portion 602 may include various scheduling information and/or control information corresponding to various portions of the DL-centric subframe. In some configurations, the control portion 602 may be a physical DL control channel (PDCCH), as indicated in FIG. 6. The DL-centric subframe may also include a DL data portion 604. The DL data portion 604 may sometimes be referred to as the payload of the DL-centric subframe. The DL data portion 604 may include the communication resources utilized to communicate DL data from the scheduling entity (e.g., UE or BS) to the subordinate entity (e.g., UE). In some configurations, the DL data portion 604 may be a physical DL shared channel (PD SCH).

The DL-centric subframe may also include a common UL portion 606. The common UL portion 606 may sometimes be referred to as an UL burst, a common UL burst, and/or various other suitable terms. The common UL portion 606 may include feedback information corresponding to various other portions of the DL-centric subframe. For example, the common UL portion 606 may include feedback information corresponding to the control portion 602. Non-limiting examples of feedback information may include an ACK signal, a NACK signal, a HARQ indicator, and/or various other suitable types of information. The common UL portion 606 may include additional or alternative information, such as information pertaining to random access channel (RACH) procedures, scheduling requests (SRs), and various other suitable types of information. As illustrated in FIG. 6, the end of the DL data portion 604 may be separated in time from the beginning of the common UL portion 606. This time separation may sometimes be referred to as a gap, a guard period, a guard interval, and/or various other suitable terms. This separation provides time for the switch-over from DL communication (e.g., reception operation by the subordinate entity (e.g., UE)) to UL communication (e.g., transmission by the subordinate entity (e.g., UE)). One of ordinary skill in the art will understand that the foregoing is merely one example of a DL-centric subframe and alternative structures having similar features may exist without necessarily deviating from the aspects described herein.

Figure 7:
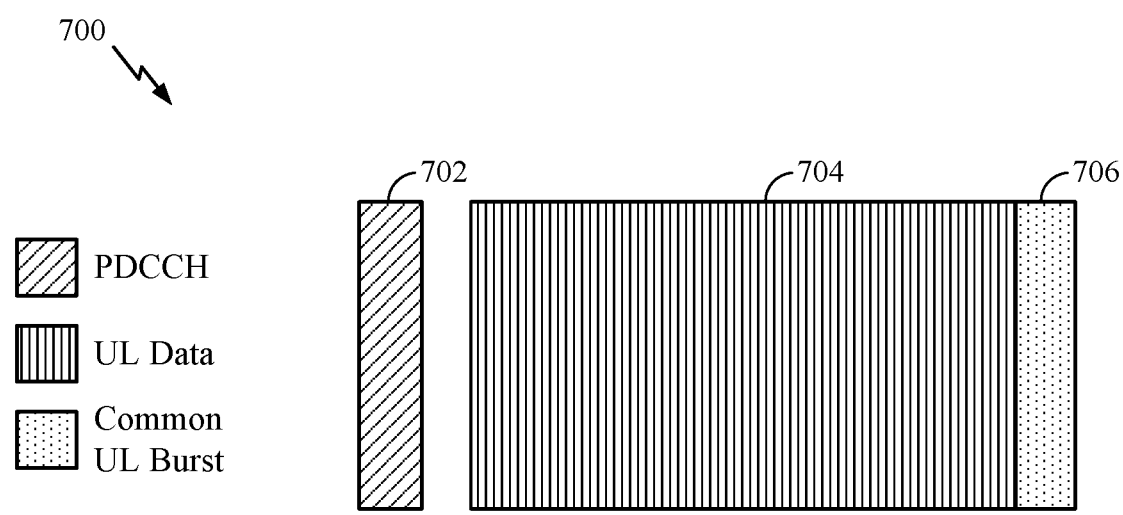
FIG. 7 illustrates an example of an UL-centric subframe, in accordance with certain aspects of the present disclosure.

FIG. 7 is a diagram 700 showing an example of an UL-centric subframe. The UL-centric subframe may include a control portion 702. The control portion 702 may exist in the initial or beginning portion of the UL-centric subframe. The control portion 702 in FIG. 7 may be similar to the control portion described above with reference to FIG. 6. The UL-centric subframe may also include an UL data portion 704. The UL data portion 704 may sometimes be referred to as the payload of the UL-centric subframe. The UL portion may refer to the communication resources utilized to communicate UL data from the subordinate entity (e.g., UE) to the scheduling entity (e.g., UE or BS). In some configurations, the control portion 702 may be a physical DL control channel (PDCCH).

As illustrated in FIG. 7, the end of the control portion 702 may be separated in time from the beginning of the UL data portion 704. This time separation may sometimes be referred to as a gap, guard period, guard interval, and/or various other suitable terms. This separation provides time for the switch-over from DL communication (e.g., reception operation by the scheduling entity) to UL communication (e.g., transmission by the scheduling entity). The UL-centric subframe may also include a common UL portion 706. The common UL portion 706 in FIG. 7 may be similar to the common UL portion 706 described above with reference to FIG. 7. The common UL portion 706 may additional or alternative include information pertaining to channel quality indicator (CQI), sounding reference signals (SRSs), and various other suitable types of information. One of ordinary skill in the art will understand that the foregoing is merely one example of an UL-centric subframe and alternative structures having similar features may exist without necessarily deviating from the aspects described herein.

In some circumstances, two or more subordinate entities (e.g., UEs) may communicate with each other using sidelink signals. Real-world applications of such sidelink communications may include public safety, proximity services, UE-to-network relaying, vehicle-to-vehicle (V2V) communications, Internet of Everything (IoE) communications, IoT communications, mission-critical mesh, and/or various other suitable applications. Generally, a sidelink signal may refer to a signal communicated from one subordinate entity (e.g., UE1) to another subordinate entity (e.g., UE2) without relaying that communication through the scheduling entity (e.g., UE or BS), even though the scheduling entity may be utilized for scheduling and/or control purposes. In some examples, the sidelink signals may be communicated using a licensed spectrum (unlike wireless local area networks, which typically use an unlicensed spectrum).

A UE may operate in various radio resource configurations, including a configuration associated with transmitting pilots using a dedicated set of resources (e.g., a radio resource control (RRC) dedicated state, etc.) or a configuration associated with transmitting pilots using a common set of resources (e.g., an RRC common state, etc.). When operating in the RRC dedicated state, the UE may select a dedicated set of resources for transmitting a pilot signal to a network. When operating in the RRC common state, the UE may select a common set of resources for transmitting a pilot signal to the network. In either case, a pilot signal transmitted by the UE may be received by one or more network access devices, such as an AN, or a DU, or portions thereof. Each receiving network access device may be configured to receive and measure pilot signals transmitted on the common set of resources, and also receive and measure pilot signals transmitted on dedicated sets of resources allocated to the UEs for which the network access device is a member of a monitoring set of network access devices for the UE. One or more of the receiving network access devices, or a CU to which receiving network access device(s) transmit the measurements of the pilot signals, may use the measurements to identify serving cells for the UEs, or to initiate a change of serving cell for one or more of the UEs.

Example Resource-Based Code Block Segmentation

Aspects of the present disclosure provide a mechanism for code-rate dependent transport block segmentation. As will be described herein, by adjusting segmentation parameters, such as code block size, based on a code rate, code block size may be optimized to achieve a desired result. For example, a smaller code block (CB) size may be selected based on a low code rate to achieve increased coding gain (relative to repeated transmission) when reliability is a priority. On the other hand, when peak data rates are a priority, lower code rates may not be desirable and larger code block sizes may be selected.

As used herein, the term code rate (or information rate) generally refers to the proportion of a data-stream that is useful (non-redundant). That is, if the code rate is k/n, for every k bits of useful information, the coder generates a total of n bits of data, of which n-k are redundant. Thus, the code rate of a convolutional code will typically be 1/2, 2/3, 3/4, 5/6, 7/8, or the like, corresponding to one redundant bit inserted after every first, second, third, fourth, fifth, sixth, or seventh bit, respectively.

Using low density parity check (LDPC) codes, the parity-check matrix can be extended to lower rates than conventional LTE turbo codes, which rely on repetition for code rates below 1/3. This may allow the LDPC codes to achieve higher coding gains also at low coding rates, making them suitable for use cases requiring high reliability. As noted above, aspects of the present disclosure allow smaller may allow transport blocks to be segmented into slightly smaller CB sizes using lower coding rates to achieve higher coding gain.

In conventional systems (e.g., LTE), a transport block size (TB_size) table defines the TB size for certain combinations of modulation coding schemes (MCS) and number of resource blocks (Num_RB). Given a transport block size index ($I_{TBS}$ obtained from the MCS) and Num_RB, the transport block size (TB_size) can be obtained from the TB_size table as a number of bits.

In general, the number of over the air (OVA) bits needed for a TB transmission may be represented as a variable B, where:

$$B=TB\_size+24.$$

to account for 24 cyclic redundancy check (CRC) bits. A TB with B larger than a maximum CB size is split (segmented) into multiple CBs. This segmentation process can be demonstrated by the following equations for a number of segmented code blocks (Num_CB) and approximate code block size (Appr_CB_size):

$$Num\_CB=B/(Max\_CB\_size-24)$$

$$Appr\_CB\_size \approx (B+Num\_CB*24)/Num\_CB$$

In practice, code block sizes are quantized to K+ and K−, where K+ and K− are the two allowable CB sizes closest to Appr_CB_size. In current systems, CB segmentation is only a function of TB_size. Thus, for multiple (MCS, Num_RB) combinations with the same TB_size and Num_CB, the quantized CB sizes K+ and K− are all the same. Every CB may be encoded with a turbo code rate 1/3, while the effective code rate is controlled by rate matching, repetition, or truncation. The Max_CB_size in such systems is 6144 bits.

Aspects of the present disclosure, however, provide for a segmentation of transport blocks that is dependent on code rate (as a criteria to select code block size). In other words, different code block sizes (values of K+ and K−) may be selected for segmentation based on a code rate. For example, a first code block size may be used for segmentation for a minimum code rate of 1/3 or more (e.g., LDPC using a first base graph BG1) while a second (smaller) code block size may be used for a minimum code rate less than 1/3 (e.g., LDPC using a second base graph BG2).

Figure 8:
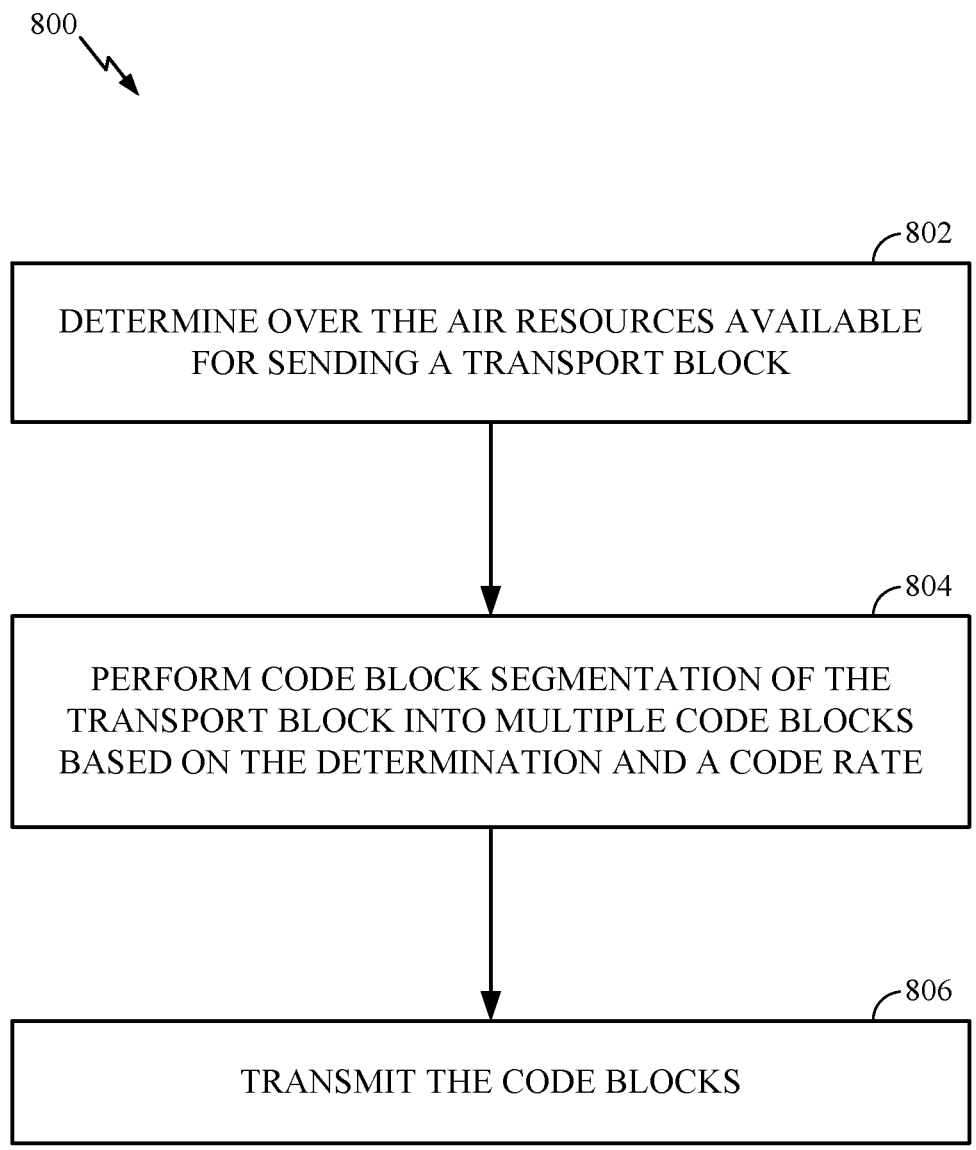
FIG. 8 illustrates example operations for resource-based code block segmentation, in accordance with certain aspects of the present disclosure.

FIG. 8 illustrates example operations 800 for code rate dependent CB segmentation, according to aspects of the present disclosure. Operations 800 may be performed by any transmitting device (e.g., UE or base station). In some examples, operations 800 may be performed by elements of base station 110 or UE 120 as shown in FIG. 4.

The operations begin, at 802, by determining over the air resources available for sending a transport block (TB). At 804, code block segmentation of the TB into multiple code blocks is performed, based on the determination of air link resources and a code rate. At 806, the code blocks are transmitted. On the receive side, a device may perform corresponding operations as the transmitter, for example, determining the code rate-based code block size used for segmentation and processing the received code blocks accordingly.

For NR, various different segmentation parameters may be agreed upon, such as:

$$Max\_CB\_size<=8192.$$

In addition to a max code block size, a code block threshold (CB_threshold) may also be introduced and used for segmentation. For example, for code block sizes below a threshold value (CB_size<CB_threshold), LDPC encoding rates may be lower than 1/3 (e.g., 1/5). For code block sizes above the threshold value (CB_size>CB_threshold), LDPC encoding rate may be greater than or equal to 1/3. The exact value of CB_threshold may be selected based on various factors, such as a desire to keep decoder length/complexity reasonable.

Code rate dependent segmentation described herein may be used as an alternative to lowering effective code rate by repetition.

This approach may be advantageous in cases where the gain from repetition may be less than the gain by reducing code rate. This may be illustrated by considering an example of a CB_size of 6000 and a number of over the air bits (Num_OVA_bits) of 30000, where different code rates are considered for different schemes. According to a first scheme (Scheme 1):

Code Rate 1/3 plus repetition: encode 6000 bits with 1/3 LDPC 4 18000 bits total OVA resource, repeating 12000 bits.

According to a second scheme (Scheme 2)

Code Rate 1/5: encode 6000 bits with 1/5 LDPC 4 30000 total bit OVA resource.

In this example, a gain of 0.3 dB may be obtained with Scheme 2, which may be greater than the gain obtained by repetition in Scheme 1. In this example, and following examples, 1/3 is used as an example of a threshold code rate, but other threshold code rates may be used to determine smaller code block sizes.

Aspects of the present disclosure may help enable transmission with a lower code rate, for example, by making (code block sizes of) TB segmentation resource dependent (e.g., considering code rate, and not just as a function of TB_size).

As described herein, TB segmentation decisions may be made as a function of not only TB_size, but also Num_OVA_bits (which depends on code rate). In general, Num_OVA_bits may be determined by modulation and coding scheme (MCS) and NUM_RB as follows:

$$(MCS, Num\_RB) \rightarrow Num\_OVA\_bits, \text{ where OVA is "over the air."}$$

Unlike prior systems, the techniques presented herein may, thus, allow TBs with the same TB_size but different resources to be segmented into different CB sizes, for example, so that the code rate of LDPC may be different. In general, the techniques may try to use OVA bits for lower code rate instead of repetition (to achieve better gain). This may apply only to code blocks of certain sizes B that are less than a maximum code block size, but greater than a threshold, such as:

$$B>CB\_threshold.$$

A rule may be conceived that allows a different CB size between the maximum CB size and a threshold value to be used based on (effective) code rate. The effective code rate may be calculated as the number of bits to transmit (B) divided by the number of OVA bits used for transmission, and the rule may be expressed as:

If B/Num_OVA_bits>1/3,
    Then: effective code rate>1/3, CB segmentation may be based on a first CB size (e.g., using a first K+ and K− similar to LTE)
Else If B/Num_OVA_bits<1/3,
    Then: CB segmentation may be performed and,
    If the resulting CB_size<CB_threshold, it may already support a lower code rate,
        Then: the first CB size may be kept (e.g., LTE like CB segmentation)

If resulting CB_size>=CB_threshold, and only support 1/3 code rate,
  Then: the CB segmentation may be redone using a new/second CB size.
For example, redoing the segmentation with a new CB size may be done as:
  Num_CB_new=B/(CB_threshold−24),
  Get new CB size K+ and K−
  If CB_threshold<Max_CB_size, for a TB with B between CB_threshold and Max_CB_size,
  Then: the TB may be split it into more than one CBs (using the new K+ and K−).
The example above demonstrates code rate-based segmentation using a threshold code rate of 1/3. In the example, a different segmentation of the TB is performed for code rates below 1/3.

Figure 9:
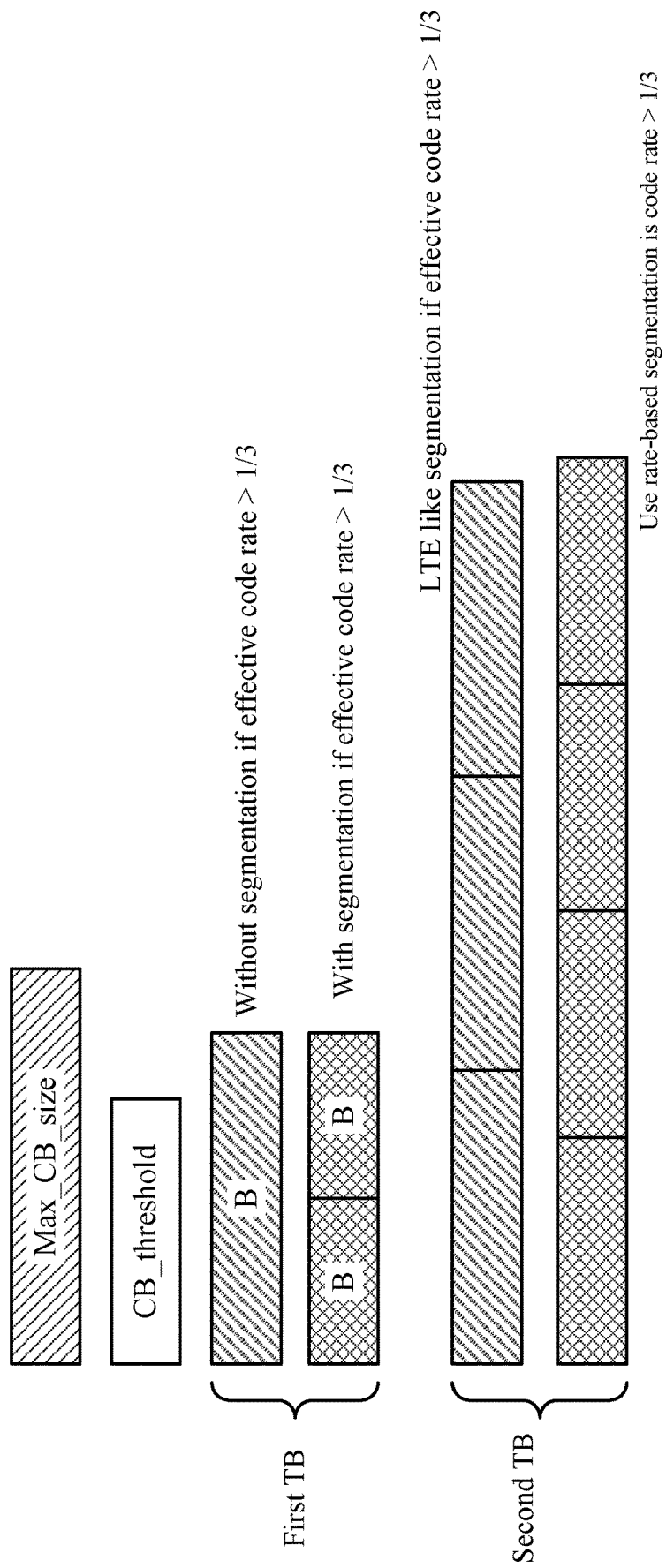
FIG. 9 illustrates example resource-based code block segmentation, in accordance with certain aspects of the present disclosure.

FIG. 9 illustrates an example of resource (code rate) dependent CB segmentation, for a first TB with a size B. As shown in the example of FIG. 9, the CB threshold size may be less than the Max_CB_Size. Even though B is greater than the CB_threshold, but less than the Max_CB_Size, there may be no segmentation if the effective code rate is >1/3. On the other hand, if the effective code rate is <1/3, the TB may be split into two CBs (e.g., based on a new K+/K−).

For example, assuming LDPC coding and that the first TB has 4000 bits (B=4000), it could be transmitted as a single CB (of BG1) at a minimum code rate of 1/3 or it could be segmented into two CBs (of BG2) and transmitted with a minimum rate of 1/5, to achieve coding gain such that different segmentation (using different code block sizes) of the same size TB may be performed based on code rate. To generalize this approach, the goal may be to segment if segmentation allows the use of a lower LDPC code rate rather than repeating more bits to reach the target code rate.

Referring again to FIG. 9, for a second TB, with B>Max_CB_Size and a code rate threshold of 1/3, a fixed segmentation may be used if the effective code rate>1/3 or, rate-based segmentation may be used if the effective code rate is <1/3. As illustrated, the rate-based segmentation results in segmentation of the second TB into 4 slightly smaller code blocks.

Those skilled in the art will recognize that the values used in these examples are to facilitate understanding and various other suitable values may be used.

The methods disclosed herein comprise one or more steps or actions for achieving the described method. The method steps and/or actions may be interchanged with one another without departing from the scope of the claims. In other words, unless a specific order of steps or actions is specified, the order and/or use of specific steps and/or actions may be modified without departing from the scope of the claims.

As used herein, a phrase referring to "at least one of" a list of items refers to any combination of those items, including single members. As an example, "at least one of: a, b, or c" is intended to cover a, b, c, a-b, a-c, b-c, and a-b-c, as well as any combination with multiples of the same element (e.g., a-a, a-a-a, a-a-b, a-a-c, a-b-b, a-c-c, b-b, b-b-b, b-b-c, c-c, and c-c-c or any other ordering of a, b, and c).

As used herein, the term "determining" encompasses a wide variety of actions. For example, "determining" may include calculating, computing, processing, deriving, investigating, looking up (e.g., looking up in a table, a database or another data structure), ascertaining and the like. Also, "determining" may include receiving (e.g., receiving information), accessing (e.g., accessing data in a memory) and the like. Also, "determining" may include resolving, selecting, choosing, establishing and the like.

The previous description is provided to enable any person skilled in the art to practice the various aspects described herein. Various modifications to these aspects will be readily apparent to those skilled in the art, and the generic principles defined herein may be applied to other aspects. Thus, the claims are not intended to be limited to the aspects shown herein, but is to be accorded the full scope consistent with the language claims, wherein reference to an element in the singular is not intended to mean "one and only one" unless specifically so stated, but rather "one or more." Unless specifically stated otherwise, the term "some" refers to one or more. All structural and functional equivalents to the elements of the various aspects described throughout this disclosure that are known or later come to be known to those of ordinary skill in the art are expressly incorporated herein by reference and are intended to be encompassed by the claims. Moreover, nothing disclosed herein is intended to be dedicated to the public regardless of whether such disclosure is explicitly recited in the claims. No claim element is to be construed under the provisions of 35 U.S.C. § 112, sixth paragraph, unless the element is expressly recited using the phrase "means for" or, in the case of a method claim, the element is recited using the phrase "step for."

The various operations of methods described above may be performed by any suitable means capable of performing the corresponding functions. The means may include various hardware and/or software component(s) and/or module(s), including, but not limited to a circuit, an application specific integrated circuit (ASIC), or processor. Generally, where there are operations illustrated in figures, those operations may have corresponding counterpart means-plus-function components with similar numbering.

For example, means for transmitting and/or means for receiving may comprise one or more of a transmit processor 420, a TX MIMO processor 430, a receive processor 438, or antenna(s) 434 of the base station 110 and/or the transmit processor 464, a TX MIMO processor 466, a receive processor 458, or antenna(s) 452 of the user equipment 120. Additionally, means for generating, means for multiplexing, and/or means for applying may comprise one or more processors, such as the controller/processor 440 of the base station 110 and/or the controller/processor 480 of the user equipment 120.

The various illustrative logical blocks, modules and circuits described in connection with the present disclosure may be implemented or performed with a general purpose processor, a digital signal processor (DSP), an application specific integrated circuit (ASIC), a field programmable gate array (FPGA) or other programmable logic device (PLD), discrete gate or transistor logic, discrete hardware components, or any combination thereof designed to perform the functions described herein. A general-purpose processor may be a microprocessor, but in the alternative, the processor may be any commercially available processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

If implemented in hardware, an example hardware configuration may comprise a processing system in a wireless node. The processing system may be implemented with a bus architecture. The bus may include any number of interconnecting buses and bridges depending on the specific application of the processing system and the overall design constraints. The bus may link together various circuits including a processor, machine-readable media, and a bus interface. The bus interface may be used to connect a network adapter, among other things, to the processing system via the bus. The network adapter may be used to implement the signal processing functions of the PHY layer. In the case of a user terminal 120 (see FIG. 1), a user interface (e.g., keypad, display, mouse, joystick, etc.) may also be connected to the bus. The bus may also link various other circuits such as timing sources, peripherals, voltage regulators, power management circuits, and the like, which are well known in the art, and therefore, will not be described any further. The processor may be implemented with one or more general-purpose and/or special-purpose processors. Examples include microprocessors, microcontrollers, DSP processors, and other circuitry that can execute software. Those skilled in the art will recognize how best to implement the described functionality for the processing system depending on the particular application and the overall design constraints imposed on the overall system.

If implemented in software, the functions may be stored or transmitted over as one or more instructions or code on a computer readable medium. Software shall be construed broadly to mean instructions, data, or any combination thereof, whether referred to as software, firmware, middleware, microcode, hardware description language, or otherwise. Computer-readable media include both computer storage media and communication media including any medium that facilitates transfer of a computer program from one place to another. The processor may be responsible for managing the bus and general processing, including the execution of software modules stored on the machine-readable storage media. A computer-readable storage medium may be coupled to a processor such that the processor can read information from, and write information to, the storage medium. In the alternative, the storage medium may be integral to the processor. By way of example, the machine-readable media may include a transmission line, a carrier wave modulated by data, and/or a computer readable storage medium with instructions stored thereon separate from the wireless node, all of which may be accessed by the processor through the bus interface. Alternatively, or in addition, the machine-readable media, or any portion thereof, may be integrated into the processor, such as the case may be with cache and/or general register files. Examples of machine-readable storage media may include, by way of example, RAM (Random Access Memory), flash memory, ROM (Read Only Memory), PROM (Programmable Read-Only Memory), EPROM (Erasable Programmable Read-Only Memory), EEPROM (Electrically Erasable Programmable Read-Only Memory), registers, magnetic disks, optical disks, hard drives, or any other suitable storage medium, or any combination thereof. The machine-readable media may be embodied in a computer-program product.

A software module may comprise a single instruction, or many instructions, and may be distributed over several different code segments, among different programs, and across multiple storage media. The computer-readable media may comprise a number of software modules. The software modules include instructions that, when executed by an apparatus such as a processor, cause the processing system to perform various functions. The software modules may include a transmission module and a receiving module. Each software module may reside in a single storage device or be distributed across multiple storage devices. By way of example, a software module may be loaded into RAM from a hard drive when a triggering event occurs. During execution of the software module, the processor may load some of the instructions into cache to increase access speed. One or more cache lines may then be loaded into a general register file for execution by the processor. When referring to the functionality of a software module below, it will be understood that such functionality is implemented by the processor when executing instructions from that software module.

Also, any connection is properly termed a computer-readable medium. For example, if the software is transmitted from a website, server, or other remote source using a coaxial cable, fiber optic cable, twisted pair, digital subscriber line (DSL), or wireless technologies such as infrared (IR), radio, and microwave, then the coaxial cable, fiber optic cable, twisted pair, DSL, or wireless technologies such as infrared, radio, and microwave are included in the definition of medium. Disk and disc, as used herein, include compact disc (CD), laser disc, optical disc, digital versatile disc (DVD), floppy disk, and Blu-ray® disc where disks usually reproduce data magnetically, while discs reproduce data optically with lasers. Thus, in some aspects computer-readable media may comprise non-transitory computer-readable media (e.g., tangible media). In addition, for other aspects computer-readable media may comprise transitory computer-readable media (e.g., a signal). Combinations of the above should also be included within the scope of computer-readable media.

Thus, certain aspects may comprise a computer program product for performing the operations presented herein. For example, such a computer program product may comprise a computer-readable medium having instructions stored (and/or encoded) thereon, the instructions being executable by one or more processors to perform the operations described herein.

Further, it should be appreciated that modules and/or other appropriate means for performing the methods and techniques described herein can be downloaded and/or otherwise obtained by a user terminal and/or base station as applicable. For example, such a device can be coupled to a server to facilitate the transfer of means for performing the methods described herein. Alternatively, various methods described herein can be provided via storage means (e.g., RAM, ROM, a physical storage medium such as a compact disc (CD) or floppy disk, etc.), such that a user terminal and/or base station can obtain the various methods upon coupling or providing the storage means to the device. Moreover, any other suitable technique for providing the methods and techniques described herein to a device can be utilized.

It is to be understood that the claims are not limited to the precise configuration and components illustrated above. Various modifications, changes and variations may be made in the arrangement, operation and details of the methods and apparatus described above without departing from the scope of the claims.

What is claimed is:

1. A method of wireless communication, comprising:
  determining a code rate for sending a transport block (TB) via time-frequency resources; and
  performing segmentation of the TB into one or more code blocks (CBs) based at least in part on the determined code rate, wherein performing the segmentation comprises:
    determining a first code block size if the code rate is less than a threshold value, or
    determining a second code block size if the code rate is greater than the threshold value; and
  transmitting the one or more CBs.

2. The method of claim 1, wherein performing the segmentation comprises determining the first code block size if the code rate is less than or equal to the threshold value.

3. The method of claim 1, wherein the second code block size is larger than the first code block size.

4. The method of claim 1, further comprising encoding the CBs using low density parity check (LDPC) coding.

5. The method of claim 4, wherein the CBs are transmitted using the determined code rate to achieve coding gain relative to repeating bits if the TB was transmitted using larger code blocks.

6. The method of claim 1, wherein performing the segmentation comprises performing segmentation of the TB into the one or more CBs based at least in part on the determined code rate and a size of the TB.

7. The method of claim 1, wherein performing the segmentation comprises performing segmentation of the TB into the one or more CBs based at least in part on the determined code rate and a maximum size of a CB.

8. An apparatus for wireless communication, comprising:
   a processor configured to:
      determine a code rate for sending a transport block (TB) via time-frequency resources, and
      perform segmentation of the TB into one or more code blocks (CBs) based at least in part on the determined code rate, wherein the processor is configured to perform the segmentation by at least in part:
         determining a first code block size if the code rate is less than a threshold value, or
         determining a second code block size if the code rate is greater than the threshold value;
   memory coupled to the processor; and
   a transmitter configured to transmit the one or more CBs.

9. The apparatus of claim 8, wherein the processor is further configured to perform the segmentation by determining the first code block size if the code rate is less than or equal to the threshold value.

10. The apparatus of claim 8, wherein the second code block size is larger than the first code block size.

11. The apparatus of claim 8, wherein the processor is further configured to encode the one or more CBs using low density parity check (LDPC) coding.

12. The apparatus of claim 11, wherein the transmitter is further configured to transmit the one or more CBs using the determined code rate to achieve coding gain relative to repeating bits if the TB was transmitted using larger code blocks.

13. The apparatus of claim 8, wherein the processor is further configured to perform segmentation of the TB into the one or more CBs based at least in part on the determined code rate and a size of the TB.

14. The apparatus of claim 8, wherein the processor is further configured to perform segmentation of the TB into the one or more CBs based at least in part on the determined code rate and a maximum size of a CB.

15. An apparatus for wireless communication, comprising:
   means for determining a code rate for sending a transport block (TB) via time-frequency resources;
   means for performing segmentation of the TB into one or more code blocks (CBs) based at least in part on the determined code rate, wherein the means for performing the segmentation is configured to:
      determine a first code block size if the code rate is less than a threshold value, or
      determine a second code block size if the code rate is greater than the threshold value; and
   means for transmitting the one or more CBs.

16. The apparatus of claim 15, wherein the means for performing the segmentation is further configured to determine the first code block size if the code rate is less than or equal to the threshold value.

17. The apparatus of claim 15, wherein the second code block size is larger than the first code block size.

18. The apparatus of claim 15, further comprising means for encoding the one or more CBs using low density parity check (LDPC) coding.

19. The apparatus of claim 15, wherein the means for performing the segmentation is further configured to perform segmentation of the TB into the one or more CBs based at least in part on the determined code rate and a size of the TB.

20. The apparatus of claim 15, wherein the means for performing the segmentation is further configured to perform segmentation of the TB into the one or more CBs based at least in part on the determined code rate and a maximum size of a CB.

* * * * *